(12) United States Patent
Kurita et al.

(10) Patent No.: US 9,891,526 B2
(45) Date of Patent: Feb. 13, 2018

(54) PATTERN FORMING METHOD

(71) Applicant: JSR CORPORATION, Tokyo (JP)

(72) Inventors: Shunsuke Kurita, Tokyo (JP); Toru Kimura, Tokyo (JP); Yoshio Takimoto, Tokyo (JP); Kazunori Takanashi, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 15/000,966

(22) Filed: Jan. 19, 2016

(65) Prior Publication Data

US 2016/0131978 A1    May 12, 2016

Related U.S. Application Data

(63) Continuation of application No. PCT/JP2014/068964, filed on Jul. 16, 2014.

(30) Foreign Application Priority Data

Jul. 24, 2013 (JP) ................. 2013-153854

(51) Int. Cl.
| | | |
|---|---|---|
| *G03F 7/32* | (2006.01) | |
| *G03F 7/20* | (2006.01) | |
| *G03F 7/075* | (2006.01) | |
| *G03F 7/004* | (2006.01) | |
| *H01L 21/311* | (2006.01) | |
| *C09K 13/00* | (2006.01) | |
| *H01L 21/3065* | (2006.01) | |

(52) U.S. Cl.
CPC ............ *G03F 7/32* (2013.01); *G03F 7/0043* (2013.01); *G03F 7/0757* (2013.01); *G03F 7/20* (2013.01); *C09K 13/00* (2013.01); *H01L 21/3065* (2013.01); *H01L 21/31122* (2013.01)

(58) Field of Classification Search
CPC . G03F 7/32; G03F 7/20; G03F 7/0043; G03F 7/0757; H01L 21/31122; H01L 21/3065; C09K 13/00
See application file for complete search history.

(56) References Cited

U.S. PATENT DOCUMENTS

| | | | |
|---|---|---|---|
| 3,769,043 A | 10/1973 | Morishima et al. | |
| 2005/0277274 A1 | 12/2005 | Karkkainen | |
| 2008/0022896 A1 | 1/2008 | Karkkainen | |
| 2010/0009297 A1 | 1/2010 | Yao et al. | |
| 2012/0319090 A1* | 12/2012 | Shinkai | C09K 11/06 257/40 |
| 2013/0302998 A1* | 11/2013 | Kugler | C23C 18/04 438/785 |
| 2014/0356792 A1* | 12/2014 | Noya | G03F 7/11 430/325 |

FOREIGN PATENT DOCUMENTS

| | | | |
|---|---|---|---|
| CN | 102336436 A | * | 1/2012 |
| JP | 11-258813 A | | 9/1999 |
| JP | 2001-284209 A | | 10/2001 |
| JP | 2003-177206 A | | 6/2003 |
| JP | 2005-173552 A | | 6/2005 |
| JP | 2006-251369 A | | 9/2006 |
| JP | 2008-39811 A | | 2/2008 |
| JP | 2008-503331 A | | 2/2008 |
| JP | 2010-85912 A | | 4/2010 |
| JP | 2011-527461 A | | 10/2011 |
| JP | 2014-137546 A | | 7/2014 |
| WO | WO 2006/040956 A1 | | 4/2006 |

OTHER PUBLICATIONS

International Search Report dated Sep. 16, 2014, in PCT/JP2014/068964 filed Jul. 16, 2014 (w/ English translation).

* cited by examiner

*Primary Examiner* — Anita K Alanko
(74) *Attorney, Agent, or Firm* — Oblon, McClelland, Maier & Neustadt, L.L.P.

(57) ABSTRACT

A pattern-forming method includes applying an inorganic film-forming composition on an upper face side of a substrate to provide an inorganic film, forming a resist pattern on an upper face side of the inorganic film; and dry-etching once or several times using the resist pattern as a mask such that the substrate has a pattern The inorganic film-forming composition includes a polyacid or a salt thereof, and an organic solvent. The step for forming a resist pattern may include the steps of: applying a resist composition on an upper face side of the inorganic film to provide a resist film; exposing the resist film; and developing the resist film exposed.

8 Claims, No Drawings

PATTERN FORMING METHOD

CROSS-REFERENCE TO RELATED APPLICATIONS

The present application is a continuation application of International Application No. PCT/JP2014/068964, filed Jul. 16, 2014, which claims priority to Japanese Patent Application No. 2013-153854, filed Jul. 24, 2013. The contents of these applications are incorporated herein by reference in their entirety.

BACKGROUND OF THE INVENTION

Field of the Invention

The present invention relates to a pattern-forming method.

Discussion of the Background

A reduction in processing size has progressed by utilizing a multilayer resist process in order to increase the degree of integration of semiconductor devices and the like. The multilayer resist process includes: forming an inorganic film using a silicon-based inorganic material; thereafter further applying a resist composition to form a resist film that is an organic film having an etching selectivity which is different from that of the inorganic film; then transferring a mask pattern through exposure; and developing the resist film using a developer to form a resist pattern. The resist pattern is then transferred to the inorganic film by dry etching, and the pattern of the resist underlayer film is finally transferred to the substrate by dry etching to obtain a substrate on which the desired pattern is formed (see Japanese Unexamined Patent Application, Publication Nos. 2001-284209, 2010-85912 and 2008-39811).

The conventional inorganic film-forming composition contains a metal compound having a hydrolyzable group such as a metal alkoxide, and formation of an inorganic film is enabled through hydrolysis or the like of the same, followed by baking.

SUMMARY OF THE INVENTION

According to one aspect of the present invention, a pattern-forming method includes applying an inorganic film-forming composition on an upper face side of a substrate to provide an inorganic film, forming a resist pattern on an upper face side of the inorganic film; and dry-etching once or several times using the resist pattern as a mask such that the substrate has a pattern. The inorganic film-forming composition includes a polyacid or a salt thereof, and an organic solvent.

DESCRIPTION OF THE EMBODIMENTS

According to an embodiment of the invention, a pattern-forming method includes the steps of:

forming an inorganic film on the upper face side of a substrate (hereinafter, may be also referred to as "inorganic film-forming step");

forming a resist pattern on the upper face side of the inorganic film (hereinafter, may be also referred to as "resist pattern-forming step"); and dry etching once or several times using the resist pattern as a mask such that the substrate has a pattern (hereinafter, may be also referred to as "substrate pattern-forming step"), in which the inorganic film is formed from an inorganic film-forming composition for a multilayer resist process (hereinafter, may be also referred to as "inorganic film-forming composition for a multilayer resist process (I)") containing:

a polyacid or a salt thereof (hereinafter, may be also referred to as "polyacid or a salt thereof (A)"); and an organic solvent (hereinafter, may be also referred to as "organic solvent (B)").

According to the pattern-forming method of the embodiment of the present invention, time-dependent alteration of the film thickness and the like of the inorganic film formed resulting from storage of the inorganic film-forming composition for a multilayer resist process for a long period of time can be lessened, and in turn, a favorable pattern can be formed with less time-dependent alteration through storage. Therefore, these can be suitably used in fabricating processes, etc., in production of semiconductors, in which further progress of miniaturization is expected in the future. Hereinafter, embodiments of the present invention will be described in detail.

Pattern-Forming Method

The pattern-forming method includes an inorganic film-forming step, a resist pattern-forming step, and a substrate pattern-forming step. The inorganic film is formed from an inorganic film-forming composition for a multilayer resist process (I).

According to the pattern-forming method, since the inorganic film-forming composition for a multilayer resist process (I) as described later is used, even if the composition after storage for a long period of time is used, an inorganic film with less variation of the film thickness can be formed, and in turn, formation of a pattern with less variation is enabled irrespective of the storage time period.

Each step of the pattern-forming method, and the inorganic film-forming composition for a multilayer resist process (I) will be explained in this order below.

Inorganic Film-Forming Step

In this step, by using the inorganic film-forming composition for a multilayer resist process (I), an inorganic film is formed on the upper face side of the substrate. Examples of the substrate include: insulating films of silicon oxide, silicon nitride, silicon nitride oxide, polysiloxane and the like; and interlayer insulating films such as wafers covered with a low-dielectric insulating film of Black Diamond (manufactured by AMAT), SiLK™ (manufactured by Dow Chemical Company), LKD5109 (manufactured by JSR Corporation) or the like that is a commercially available product. Also, a patterned substrate having wiring groove (trench), plug grooves (via) or the like may be used as the substrate. With respect to a method for forming the inorganic film, a coating film of the inorganic film-forming composition for a multilayer resist process (I) is provided by application on the surface of the substrate, and the coating film is subjected to a heat treatment, or both irradiation with an ultraviolet ray and a heat treatment to allow for hardening, whereby the inorganic film can be formed. The method for applying the inorganic film-forming composition for a multilayer resist process (I) is exemplified by a spin coating method, a roll coating method, a dip coating method, and the like. Further, the heating temperature is typically 150° C. to 500° C., and preferably 180° C. to 350° C. The heating time period is typically 30 sec to 1,200 sec, and preferably 45 sec to 600 sec. Moreover, after the application of the inorganic film-forming composition for a multilayer resist process (I), irradiation with an ultraviolet ray may be executed. The thickness of the inorganic film is typically about 5 nm to 50 nm.

It is to be noted that before the inorganic film-forming step, a step of forming on the upper face side of the substrate, a resist underlayer film that is different from the inorganic film may be included. In this case, the inorganic film is formed on the upper face side of the formed resist underlayer film, in the inorganic film-forming step. The resist underlayer film is exemplified by an organic film formed using a composition for a resist underlayer film, a carbon film formed according to a conventionally well-known CVD (Chemical Vapor Deposition) process, and the like. As a resist underlayer film-forming composition, a conventionally well-known composition may be used, and for example, NFC HM8005 (manufactured by JSR Corporation) and the like may be included. With respect to a method for forming the resist underlayer film, for example, a coating film of the resist underlayer film-forming composition is provided by application on the substrate, and the coating film is subjected to a heat treatment, or both irradiation with an ultraviolet ray and a heat treatment to allow for hardening, whereby the resist underlayer film can be formed. The method for applying the resist underlayer film-forming composition is exemplified by a spin coating method, a roll coating method, a dip coating method, and the like. Further, the heating temperature is typically 150° C. to 500° C., and preferably 180° C. to 350° C. The heating time period is typically 30 sec to 1,200 sec, and preferably 45 sec to 600 sec. The thickness of the resist underlayer film is typically about 50 nm to 500 nm.

In addition, on the surface of the substrate, an other underlayer film may be provided which is different from the resist underlayer film obtained by using the resist underlayer film-forming composition. An antireflective function, flatness of coated films, high etching resistance to fluorine-containing gas such as $CF_4$, or the like may be imparted to the other underlayer film. As the other underlayer film, for example, a commercially available product may be used.

Resist Pattern-Forming Step

In this step, a resist pattern is formed on the upper face side of the inorganic film formed in the inorganic film-forming step.

In forming the resist pattern, for example, a procedure in which a resist composition is used, a procedure in which a nanoimprint lithography is employed, a procedure in which a directed self-assembling composition is used, or the like may be employed.

Procedure in which a Resist Composition is Used

In the procedure in which a resist composition is used, the resist pattern-forming step preferably includes the steps of:

providing a resist film from a resist composition on the upper face side of the inorganic film (hereinafter, may be also referred to as "resist film-providing step");

exposing the resist film (hereinafter, may be also referred to as "exposure step"); and developing the resist film exposed (hereinafter, may be also referred to as "development step").

Each step is explained below.

Resist Film-Providing Step

In this step, a resist film is provided from a resist composition on the upper face side of the inorganic film. The resist composition is exemplified by: a chemically amplified resist composition which contains an acid generating agent, and which will be soluble in an alkaline aqueous developer solution and will be hardly soluble in an organic solvent developer solution, at a light-exposed site; a chemically amplified resist composition which contains an acid generating agent and a crosslinking agent, and which will be hardly soluble in an alkaline aqueous developer solution and an organic solvent developer solution at a light-exposed site; a resist composition which contains an alkali-soluble resin and a quinone diazide type photosensitizing agent, and which will be soluble in an alkaline aqueous developer solution at a light-exposed site; and the like. Among these resist compositions, the chemically amplified resist composition which contains an acid generating agent, and which will be soluble in an alkaline aqueous developer solution and will be hardly soluble in an organic solvent developer solution, at a light-exposed site is preferred.

The resist film can be formed by; prebaking the coating film provided through applying the resist composition; and evaporating the solvent in the coating film (i.e., the solvent contained in the resist composition). The temperature of the prebaking is adjusted in accordance with the type of the resist composition used and the like, and the temperature of the prebaking falls within a range of preferably 30° C. to 200° C., and more preferably 50° C. to 150° C. The heating time period is typically 30 sec to 200 sec, and preferably 45 sec to 120 sec. In addition, on the surface of the resist film, other coating film may be further provided. The thickness of the resist film is typically 1 nm to 500 nm, and preferably 10 nm to 300 nm.

Exposure Step

In this step, the resist film thus obtained is exposed. The exposure is usually carried out by selective irradiation with a radioactive ray through a photomask. The radioactive ray may be appropriately selected from among visible light rays, ultraviolet rays, far ultraviolet rays, X-rays, electron beams, γ-rays, molecular beams, ion beams and the like, in accordance with the type of the acid generating agent used in the resist composition. The radioactive ray is preferably a far ultraviolet ray, and more preferably a KrF excimer laser (248 nm), an ArF excimer laser (193 nm), an $F_2$ excimer laser (wavelength: 157 nm), a $Kr_2$ excimer laser (wavelength: 147 nm), an ArKr excimer laser (wavelength: 134 nm), and an extreme ultraviolet ray (wavelength: 13.5 nm, etc.). The exposure may also be executed through a liquid immersion medium. It is to be noted that a liquid immersion upper layer film may be also formed on the resist film by using a composition for forming a liquid immersion upper layer film.

In order to improve the resolution, the pattern profile, the developability, etc. of the resist film, post exposure baking (PEB) is preferably executed after the exposure. The temperature of PEB may be appropriately adjusted in accordance with the type of the resist composition employed and the like. The temperature of PEB is preferably 50° C. to 180° C., and more preferably 70° C. to 150° C. The time period of heating is typically 30 sec to 200 sec, and preferably 45 sec to 120 sec.

Development Step

In this step, the resist film exposed is developed. The developer solution which may be used in the development may be appropriately selected in accordance with the type of the resist composition employed. In the case of the development with an alkali, examples of the developer solution which may be used include aqueous alkaline solutions of: inorganic alkalis such as sodium hydroxide, potassium hydroxide, sodium carbonate, sodium silicate, sodium metasilicate and ammonia water; primary amines such as ethylamine and n-propylamine; secondary amines such as diethylamine and di-n-propylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, pyrrole, piperidine and choline; cyclic amines such as pyrrole and piperidine; 1,8- diazabicyclo[5.4.0]-7-undecene, 1,5-diazabicyclo[4.3.0]-5-nonene, and the like. Alternatively, a developer solution prepared by adding an appropriate amount of a water soluble organic solvent, for example, an alcohol such as methanol and ethanol and/or a surfactant to these aqueous alkaline solutions is also acceptable.

Further, in the case of the development with an organic solvent, examples of the developer solution which may be used include organic solvents exemplified as the organic solvent (B) which may be contained in the inorganic film-forming composition for a multilayer resist process (I).

The content of the organic solvent in the organic solvent developer solution is preferably no less than 80% by mass, and more preferably 100%. When the content of the organic solvent in the developer solution is no less than 80% by mass, the contrast of the pattern depending on the exposure can be improved, and as a result, formation of a pattern superior in development characteristics and lithography characteristics is enabled. It is to be noted that a basic compound such as an amine may be added to the organic solvent developer solution for the purpose of adjusting the solubility of the light-exposed site into the developer solution.

After the development, the resist pattern is preferably washed with a rinse agent. Accordingly, the resist pattern is obtained.

Resist Composition

The resist composition used in the resist pattern-forming step preferably contains:

(α) a polymer having an acid-labile group that is dissociated by an action of an acid; and (β) an acid generator.

Moreover, the resist composition may contain other polymer except for the polymer (α).

(α) Polymer

The polymer (α) has an acid-labile group that is dissociated by an action of an acid. The specific structure of the polymer (α) is not particularly limited as long as it has an acid-labile group that is dissociated by an action of an acid, and the polymer (α) preferably has a structural unit (I) that includes an acid-labile group represented by the following formula (4), for example.

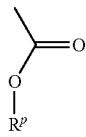

(4)

In the above formula (4), $R^p$ represents an acid-labile group.

When the structural unit (I) has the group represented by the above formula (4), the solubility of the resist film used in the pattern-forming method, in the developer solution at the light-exposed site can be changed, and as a result, formation of a resist pattern that is superior in resolution is enabled.

The structural unit (I) is preferably represented by the following formula (5).

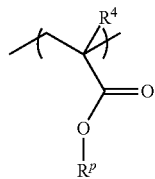

(5)

In the above formula (5), $R^4$ represents a hydrogen atom, a methyl group or a trifluoromethyl group; and $R^p$ is as defined in the above formula (4).

When the structural unit (I) has the above specific structure, incorporation of the structural unit (I) into the polymer (α) of the resist composition can be further facilitated. Consequently, the solubility of the resist film in the developer solution at the light-exposed site can be further changed, and as a result, formation of a resist pattern that is more superior in resolution is enabled.

The acid-labile group represented by $R^p$ is preferably represented by the following formula (6).

(6)

In the above formula (6), $R^{p1}$ to $R^{p3}$ each represent an alkyl group having 1 to 4 carbon atoms or an alicyclic hydrocarbon group having 4 to 20 carbon atoms, wherein a part or all of hydrogen atoms included in the alkyl group and the alicyclic hydrocarbon group may be substituted, and $R^{p2}$ and $R^{p3}$ may taken together represent a divalent alicyclic hydrocarbon group having 4 to 20 carbon atoms together with the carbon atom to which $R^{p2}$ and $R^{p3}$ bond.

In the above formulae (4) and (5) when the acid-labile group represented by $R^p$ is the group having a specific structure represented by the above formula (6), the acid-labile group is likely to be dissociated by an action of an acid generated at a light-exposed site. Consequently, according to the pattern-forming method, the solubility of the resist film in the developer solution at the light-exposed site can be even further changed, and as a result, formation of a resist pattern that is still more superior in resolution is enabled.

(β) Acid Generator

The acid generator (β) generates an acid upon an exposure, and the acid allows the acid-labile group present in the polymer (α) to be dissociated, whereby the solubility of the polymer (α) in the developer solution is changed.

The acid generator (β) is exemplified by an onium salt compound, an N-sulfonyloxyimide compound, a halogen-containing compound, a diazo ketone compound, and the like.

Examples of the onium salt compound include sulfonium salts, tetrahydrothiophenium salts, iodonium salts, phosphonium salts, diazonium salts, pyridinium salts, and the like.

Of these, the acid generator (β) is preferably an onium salt compound, more preferably a sulfonium salt, and still more preferably triphenylsulfonium 2-bicyclo[2.2.1]hept-2-yl-1,1-difluoroethanesulfonate and triphenylsulfonium 2-(1-adamantyl)-1,1-difluoroethanesulfonate. The acid generator (β) may be to used either alone of one type or a combination of two or more types thereof.

When the acid generator (β) is the acid generating agent, in light of ensuring the sensitivity and developability of the resist composition, the content of the same with respect to 100 parts by mass of the polymer (α) is typically no less than 0.1 parts by mass and no greater than 20 parts by mass, and preferably no less than 0.5 parts by mass and no greater than 15 parts by mass.

Procedure Involving Nanoimprint Lithography

In the procedure in which a nanoimprint lithography is employed for forming the resist pattern, the resist pattern-forming step preferably includes the step of forming a resist pattern on the inorganic film by nanoimprint lithography (hereinafter, may be also referred to as "nanoimprinted resist pattern-forming step").

The nanoimprinted resist pattern-forming step is explained below.

Nanoimprinted Resist Pattern-Forming Step

In this step, a resist pattern is formed on the inorganic film by nanoimprint lithography. This resist pattern can be formed by using, for example, a radiation-sensitive curable composition. Specifically, the nanoimprinted resist pattern-forming step includes: providing a pattern formation layer by applying a radiation-sensitive curable composition on the upper face side of the inorganic film formed in the inorganic film-forming step; subjecting the surface of a mold having a reversal pattern on the surface thereof to a hydrophobilization treatment; pressing the surface of the mold subjected to the hydrophobilization treatment onto the pattern formation layer; exposing the pattern formation layer while pressing the mold; and releasing the mold from the pattern formation layer exposed.

In this case, the curable composition may contain a curing accelerator and the like. The curing accelerator is exemplified by a radiation-sensitive curing accelerator and a heat curing accelerator. Of these, a radiation-sensitive curing accelerator is preferred. The radiation-sensitive curing accelerator may be appropriately selected in accordance with the constituent unit constituting the radiation-sensitive composition for nanoimprinting, and is exemplified by a photoacid generating agent, a photobase generator, a photosensitizing agent, and the like. It is to be noted that two or more types of the radiation-sensitive curing accelerator may be used in combination.

Examples of the application method include an ink jet method, a dip coating method, an air knife coating method, a curtain coating method, a wire bar coating method, a gravure coating method, an extrusion coating method, a spin coating method, a slit scanning method, and the like.

The hydrophobilization treatment of the mold is carried out by using a release agent, etc., on the surface of the mold having a reversal pattern on the surface thereof. It is necessary that the mold is configured with an optically transparent material. Examples of the optically transparent material include: glass, quartz, optically transparent resins such as PMMA and a polycarbonate resin; transparent metal vapor deposition films; soft films of polydimethylsiloxane, etc.; photo-curing films; metal films; and the like.

The release agent is exemplified by a silicon-based release agent, a fluorine-based release agent, a polyethylene-based release agent, a polypropylene-based release agent, a paraffin-based release agent, a montan-based release agent, a carnauba-based release agent, and the like. It is to be noted that the release agent may be used either alone, or two or more types thereof may be used in combination. Of these, the silicon-based release agent is preferred. Examples of the silicon-based release agent include polydimethylsiloxane, acrylsilicone graft polymers, acrylsiloxane, arylsiloxane, and the like.

The pressing is executed onto the pattern formation layer with the mold subjected to the hydrophobilization treatment. By the pressing of the mold having a relief pattern onto the pattern formation layer, the relief pattern of the mold is formed on the pattern formation layer. The pressure applied when the pressing of the mold is executed is typically 0.1 MPa to 100 MPa, preferably 0.1 MPa to 50 MPa, and more preferably 0.1 MPa to 30 MPa. The pressing time period is typically 1 sec to 600 sec, preferably 1 sec to 300 sec, and more preferably 1 sec to 180 sec.

In the exposure step, the pattern formation layer is exposed while the pressing of the mold is continued. By the exposure of the pattern formation layer, a radical is generated from the photopolymerization initiator contained in the radiation-sensitive composition for nanoimprinting. Thus, the pattern formation layer composed of the radiation-sensitive composition for nanoimprinting is cured in a state in which the relief pattern of the mold is transferred. The transfer of the relief pattern enables use for an interlayer insulating film of semiconductor elements such as LSI, system LSI, DRAM, SDRAM, RDRAM, D-RDRAM, for example, as well as a resist film in manufacturing semiconductor elements, and the like.

It is to be noted that in a case where a thermosetting curable composition is employed, the curing is allowed by a heat curing step in place of the exposure step described above. When the heat curing is carried out, the heating atmosphere, the heating temperature and the like are not particularly limited. For example, the heating may be conducted in an inert atmosphere or under a reduced pressure, at 40° C. to 200° C. The heating may be carried out using a hot plate, an oven, a furnace, or the like.

Finally, the mold is released from the pattern formation layer. The releasing method is not particularly limited, and may be carried out by, for example, moving the mold away from the substrate while the substrate is immobilized, moving the substrate away from the mold while the mold is immobilized, or pulling both the substrate and the mold in opposite directions.

Substrate Pattern-Forming Step

In this step, a pattern is formed on the substrate by one or multiple dry etching using the formed resist pattern as a mask. It is to be noted that in a case where the resist underlayer film is provided, the inorganic film, the resist underlayer film and the substrate are sequentially dry etched using the resist pattern as a mask to form the pattern. The dry etching may be executed using a well-known dry etching apparatus. In addition, examples of the gas which may be used as a source gas in the dry etching include: oxygen atom-containing gases such as $O_2$, CO and $CO_2$; inert gases such as He, $N_2$ and Ar; chlorine-based gases such as $Cl_2$ and $BCl_3$; fluorine-based gases such as $CHF_3$ and $CF_4$; other gases such as $H_2$ and $NH_3$, which may be selected depending on the elemental composition of the substance to be etched. It is to be noted that these gases may also be used in mixture.

Alternatively, the inorganic film-forming composition for a multilayer resist process (I) may be also used in a forming method of a reversal pattern.

The forming method of a reversal pattern includes the steps of:

forming a resist pattern (hereinafter, may be also referred to as "resist pattern-forming step"), filling in spaces of the resist pattern with the inorganic film-forming composition for a multilayer resist process (I) (hereinafter, may be also referred to as "filling step"); and removing the resist pattern (hereinafter, may be also referred to as "removing step").

In regard to each step, an explanation is made in the following.

Resist Pattern-Forming Step

The resist pattern formation in this step may be carried out in a similar manner to that in the resist pattern-forming step of the pattern-forming method described above. More specifically, a procedure in which a resist composition is used, a procedure in which a nanoimprint lithography is employed, a procedure in which a directed self-assembling composition is used or the like may be adopted as described above.

Filling Step

In this step, the spaces of the resist pattern formed in the resist pattern-forming step are filled with the inorganic film-forming composition for a multilayer resist process (I). Specifically, on the upper face side of the resist-patterned substrate, the inorganic film-forming composition for a multilayer resist process (I) is applied by an adequate coating means such as spin coating, cast coating or roll coating, whereby the spaces of the resist pattern are filled with the inorganic film-forming composition.

Furthermore, in this step, a drying step is preferably carried out after filling the spaces of the resist pattern with the inorganic film-forming composition for a multilayer resist process (I). Although the drying procedure in the drying step is not particularly limited, for example, baking enables the organic solvent in the composition to be volatilized. The baking conditions may be appropriately adjusted in accordance with the formulation of the inorganic film-forming composition for a multilayer resist process (I), but the baking temperature is typically 80 to 250° C., and preferably 80 to 200° C. When the baking temperature is 80 to 180° C., a flattening step described later, particularly a flattening processing by a wet etching back method can be smoothly carried out. Furthermore, the baking time period is typically for 10 sec to 300 sec, and preferably for 30 sec to 180 sec. The thickness of the resin film for a reversal pattern formed from the inorganic film-forming composition for a multilayer resist process (I) after the drying is not particularly limited, but the thickness is typically 10 nm to 1,000 nm, and preferably 50 nm to 500 nm.

Removing Step

In this step, a reversal pattern is formed by removing the resist pattern from the resist pattern in which the spaces of the pattern are filled with the inorganic film-forming composition for a multilayer resist process in the filling step. Specifically, a flattening processing for exposing the upper surface of the resist pattern is preferably carried out first. Then, dry etching, or removal by dissolution removes the resist pattern, whereby a predetermined reversal pattern is obtained. As a flattening method for use in the flattening processing, an etching method such as dry etching back or wet etching back, as well as a CMP method and the like may be employed. Of these, dry etching back in which a fluorine gas or the like is used, or wet etching back is preferred in light of the low cost. It is to be noted that the processing conditions in the flattening processing are not particularly limited, and may be appropriately adjusted. In addition, for removal of the resist pattern, dry etching is preferred, and specifically, oxygen etching or ozone etching is preferably employed. For the dry etching, a well-known resist peeling apparatus may be used such as an oxygen plasma ashing apparatus or an ozone ashing apparatus. It is to be noted that the etching processing conditions are not particularly limited, and may be appropriately adjusted.

Inorganic Film-Forming Composition for a Multilayer Resist Process (I)

The inorganic film-forming composition for a multilayer resist process (I) contains the polyacid or the salt thereof (A), and the organic solvent (B). The inorganic film-forming composition for a multilayer resist process (I) may contain as a favorable component, (C) a compound represented by the following formula (1) (hereinafter, may be also referred to as "compound (C)") as described later, and may also contain other optional component within a range not leading to impairment of the effects of the present invention. In the following, each component is explained.

(A) Polyacid or a Salt Thereof

The polyacid or the salt thereof (A) is an oxo acid having a high molecular weight produced through condensation of acid groups that include a metal atom, or a salt of the oxo acid and includes polyoxometalate. The inorganic film-forming composition for a multilayer resist process (I) is superior in the storage stability owing to containing the polyacid or the salt thereof (A). In addition, for the same reason, formation of an inorganic film, which is accompanied by less time-dependent alteration of film thickness, etc., as a result of storage for a long period of time, is enabled. Consequently, a favorable pattern can be formed with less time-dependent alteration through storage of the inorganic film-forming composition for a multilayer resist process (I), according to the pattern-forming method. The inorganic film-forming composition for a multilayer resist process (I) contains the polyacid or the salt thereof (A) as a precursor of an inorganic film. The polyacid or the salt thereof (A) is more stable against hydrolysis, thermal degradation and the like, as compared with metal compounds, etc., having a hydrolyzable group such as metal alkoxides used as a precursor of inorganic films used in conventional inorganic film-forming compositions for multilayer resist processes. In addition, according to the inorganic film-forming composition containing the highly stable polyacid or a salt thereof (A), formation of the inorganic film is enabled by baking and the like. Therefore, the inorganic film-forming composition for a multilayer resist process (I) is superior in the storage stability, and is prevented from deterioration even if stored in an ambient air. In addition, even if stored for a long period of time, time-dependent alteration of the thickness of the formed inorganic film, and the like can be lessened. As a result, a favorable pattern can be formed with less time-dependent alteration through storage.

Although the metal atom included in the polyacid or the salt thereof (A) is not particularly limited as long as it is a metal atom, examples of the metal atom include atoms of: Group 4 elements such as titanium, zirconium and hafnium; Group 5 elements such as vanadium, niobium and tantalum; Group 6 elements such as chromium, molybdenum, and tungsten; and the like.

Of these, the atoms of Group 4 elements, Group 5 elements and Group 6 elements are preferred, titanium, zirconium, vanadium, niobium, tantalum, molybdenum and tungsten are more preferred, and molybdenum and tungsten are still more preferred.

The polyacid is exemplified by: a isopolyacid having the metal atom alone as the center atom; a heteropolyacid having the metal atom and a heteroelement as the center atom; and the like.

Examples of the isopolyacid include those having an anion represented by the following formula (2), and the like.

$$[M_xO_y]^{m-} \quad (2)$$

In the above formula (2), M represents titanium, zirconium, vanadium, niobium, tantalum, molybdenum or tungsten; x is an integer of 1 to 200; y is an integer of 3 to 2,000; and m is an integer of 1 to 200.

M is preferably molybdenum or tungsten.

In the above formula (2), x is preferably an integer of 1 to 100, more preferably an integer of 1 to 20, and still more preferably an integer of 5 to 15.

In the above formula (2), y is preferably an integer of 3 to 300, more preferably an integer of 3 to 60, and still more preferably an integer of 15 to 45.

In the above formula (2), m is preferably an integer of 1 to 50, more preferably an integer of 1 to 20, and still more preferably an integer of 1 to 10.

Examples of the counter cation of the anion represented by the above formula (2) include: (hydrogen ion); alkali metal ions such as $Li^+$, $Na^+$ and $K^+$; alkaline earth metal ions such as $Mg^{2+}$ and $Ca^{2+}$; $NH_4^+$, $NR_4^+$ (wherein, R represents a hydrogen atom or a monovalent hydrocarbon group); and the like. Of these, $H^+$ and $NH_4^+$ are preferred.

In an exemplary isopolyacid or a salt thereof, a metatungstate ion $[W_{12}O_{40}]^{8-}$, a paratungstate ion $[W_{12}O_{42}]^{12-}$, a hexatungstate ion $[W_6O_{19}]^{2-}$, an octamolybdate ion $[Mo_8O_{26}]^{4-}$, a paramolybdate ion $[Mo_7O_{24}]^{6-}$, a hexamolybdate ion $[Mo_6O_{19}]^{2-}$, a metavanadate ion $[VO_3]_n^{n-}$, a decavanadate ion $[V_{10}O_{28}]^{6-}$, a hexaniobate ion $[Nb_6O_{19}]^{8-}$, a decaniobate ion $[Nb_{10}O_{28}]^{6-}$, a hexatantalate ion $[Ta_6O_{19}]^{8-}$ or the like is included as the anion, and $H^+$, $Li^+$, $Na^+$, $K^+$, $Mg^{2+}$, $Ca^{2+}$, $NH_4^+$, $N(CH_3)_4^+$ or the like is included as the cation.

Examples of the hetero atom composing the heteropolyacid include phosphorus, silicon, boron, aluminum, germanium, and the like. Of these, phosphorus and silicon are preferred.

Examples of the heteropolyacid include those having an anion represented by the following formula (3), and the like.

$$[X_aM_bO_c]^{n-} \quad (3)$$

In the above formula (3), M represents titanium, zirconium, vanadium, niobium, tantalum, molybdenum or tungsten; X represents phosphorus or silicon; a is an integer of 1 to 100; b is an integer of 1 to 200; c is an integer of 3 to 2,000; and n is an integer of 1 to 200, wherein a is no greater than b.

M is preferably molybdenum or tungsten.

In the above formula (3), a is preferably an integer of 1 to 50, more preferably an integer of 1 to 20, still more preferably an integer of 1 to 5, and particularly preferably 1.

In the above formula (3), b is preferably an integer of 1 to 100, more preferably an integer of 1 to 40, and still more preferably 5 to 20.

In the above formula (3), c is preferably an integer of 3 to 1,000, more preferably an integer of 3 to 400, and still more preferably 3 to 100.

In the above formula (3), n is preferably an integer of 1 to 100, more preferably an integer of 1 to 40, and still more preferably an integer of 1 to 10.

Examples of the counter cation of the anion represented by the above formula (3) include: $H^+$ (hydrogen ion); alkali metal ions such as $Li^+$, $Na^+$ and $K^+$; alkaline earth metal ions such as $Mg^{2+}$ and $Ca^{2+}$; $NH_4^+$, $NR_4^+$ (wherein, R represents a hydrogen atom or a monovalent hydrocarbon group); and the like. Of these, $NH_4^+$ is preferred.

In regard to the heteropolyacid or a salt thereof, examples of the heteropolyacid include silicotungstic acid $(H_4[SiW_{12}O_{40}].zH_2O)$, phosphotungstic acid $(H_3[PW_{12}O_{40}].zH_2O)$, silicovanadotungstic acid $(H_{4+i}[SiV_iW_{12-i}O_{40}].zH_2O)$, phosphovanadotungstic acid $(H_{3+i}[PV_iW_{12-i}O_{40}].zH_2O)$, silicomolybdotungstic acid $(H_{4+i}[SiMo_iW_{12-i}O_{40}].zH_2O)$, phosphomolybdotungstic acid $(H_{3+1}[PMo_iW_{12-i}O_{40}].zH_2O))$, phosphomolybdic acid $(H_3[PMo_{12}O_{40}].zH_2O)$, silicomolybdic acid $(H_4[SiMo_{12}O_{40}].zH_2O)$, phosphovanadomolybdic acid $(H_{3+i}[PV_iMo_{12-i}O_{40}].zH_2O)$, silicovanadomolybdic acid $(H_{4+i}[SiV_iMo_{12-i}O_{40}].zH_2O))$, silicovanadic acid $(H_4[SiV_{12}O_{40}].zH_2O)$, phosphovanadic acid $(H_3[PV_{12}O_{40}].zH_2O)$, phosphomolybdovanadic acid $(H_{3+i}[PMoV_{12-i}O_{40}].zH_2O)$ (wherein, i is an integer of 1 to 11), and the like.

In addition, examples of the salt of the heteropolyacid include the heteropolyacids described above in which a part or all of $H^+$ is substituted with $Li^+$, $Na^+$, $K^+$, $Mg^{2+}$, $Ca^{2+}$, $NH_4^+$, $N(CH_3)_4^+$, etc., and the like.

Of these, the polyacid or the salt thereof (A) is preferably a salt of isopolyacid and a salt of heteropolyacid, more preferably a metatungstate salt, a molybdate salt and a phosphotungstate salt, and still more preferably ammonium metatungstate $[(NH_4)_6(H)_2][W_{12}O_{40}])$, ammonium molybdate $([(NH_4)_6]Mo_7O_{24}])$ and ammonium phosphotungstate $([(NH_4)_3][PW_{12}O_{40}]]$.

The content of the polyacid or the salt thereof (A) with respect to the total solid content in the inorganic film-forming composition for a multilayer resist process (I) is preferably no less than 80% by mass, more preferably no less than 90% by mass, and still more preferably no less than 95% by mass.

(B) Organic Solvent

The inorganic film-forming composition for a multilayer resist process (I) contains the organic solvent (B). The organic solvent (B) is not particularly limited as long as it enables the polyacid (A), and optional component(s) which may be contained as needed to be dissolved or dispersed therein.

The organic solvent (B) is exemplified by an alcohol solvent, a ketone solvent, an amide solvent, an ether solvent, an ester solvent and the like. These solvents may be used either alone of one type, or two or more types thereof may be used in combination.

Examples of the alcohol solvent include:

monohydric alcohol solvents such as methanol, ethanol, n-propanol, isopropanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol monoalkyl ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, methyl n-pentyl ketone, ethyl n-butyl ketone, methyl n-hexyl ketone, diisobutyl ketone and trimethylnonanone;

cyclic ketone solvents such as cyclopentanone, cyclohexanone, cycloheptanone, cyclooctanone and methylcyclohexanone;

acetonylacetone, diacetone alcohol, acetophenone; and the like.

Examples of the amide solvent include:

chain amide solvents such as N-methylformamide, N,N-dimethylformamide, N,N-diethylformamide, acetamide, N-methylacetamide, N,N-dimethylacetamide and N-methylpropionamide;

cyclic amide solvents such as N,N'-dimethylimidazolidinone and N-methylpyrrolidone; and the like.

Examples of the ester solvent include:

carbonic acid ester solvents such as diethyl carbonate and propylene carbonate;

carboxylic acid ester solvents such as methyl acetate, ethyl acetate, γ-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, diethyl phthalate, glycol diacetate and methoxytriglycol acetate;

lactone solvents such as γ-butyrolactone and γ-valerolactone;

polyhydric alcohol monoalkyl ether acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate; and the like.

Of these organic solvents (B), an alcohol solvent and an ester solvent are preferred, a polyhydric alcohol monoalkyl ether solvent and a polyhydric alcohol monoalkyl ether acetate solvent are more preferred, a propylene glycol monoalkyl ether solvent and a propylene glycol monoalkyl ether acetate solvent are still more preferred, and propylene glycol monomethyl ether acetate, propylene glycol monoethyl ether and propylene glycol monopropyl ether are yet more preferred.

The content of the organic solvent (B) is adjusted such that the content of the polyacid or the salt thereof (A) in the inorganic film-forming composition for a multilayer resist process (I) becomes preferably 0.5% by mass to 20% by mass, and more preferably 0.5% by mass to 15% by mass.

(C) Compound

The compound (C) is represented by the following formula (1). When the inorganic film-forming composition for a multilayer resist process (I) further contains the compound (C), the storage stability can be further improved.

$$R^1\text{—CO—}CHR^3\text{—CO—}R^2 \quad (1)$$

In the above formula (1), $R^1$ and $R^2$ each independently represent a substituted or unsubstituted hydrocarbon group having 1 to 20 carbon atoms or a substituted or unsubstituted oxyhydrocarbon group having 1 to 20 carbon atoms; and $R^3$ represents a hydrogen atom or a substituted or unsubstituted hydrocarbon group having 1 to 20 carbon atoms.

Examples of the hydrocarbon group having 1 to 20 carbon atoms which may be represented by $R^1$, $R^2$ and $R^3$ include:

chain hydrocarbon groups, e.g., alkyl groups such as a methyl group, an ethyl group, a propyl group and a butyl group; alkenyl groups such as an ethenyl group, a propenyl group and a butenyl group; and alkynyl groups such as an ethynyl group, a propynyl group and a butynyl group;

alicyclic hydrocarbon groups, e.g., cycloalkyl groups such as a cyclopropyl group, a cyclobutyl group, a cyclopentyl group, a cyclohexyl group, a norbornyl group and an adamantyl group; and cycloalkenyl groups such as a cyclopropenyl group, a cyclobutenyl group, a cyclopentenyl group, a cyclohexenyl group and a norbornenyl group;

aromatic hydrocarbon groups, e.g., aryl groups such as a phenyl group, a tolyl group, a xylyl group, a mesityl group, a naphthyl group and an anthryl group; and aralkyl groups such as a benzyl group, a phenethyl group and a naphthylmethyl group; and the like.

Examples of the oxyhydrocarbon group having 1 to 20 carbon atoms which may be represented by $R^1$ and $R^2$ include:

oxy chain hydrocarbon groups, e.g., alkoxy groups such as a methoxy group, an ethoxy group, a propoxy group and a butoxy group; alkenyloxy groups such as an ethenyloxy group, a propenyloxy group and a butenyloxy group; and alkynyloxy groups such as an ethynyloxy group, a propynyloxy group and a butynyloxy group;

oxyalicyclic hydrocarbon groups, e.g., cycloalkyloxy groups such as a cyclopropyloxy group, a cyclobutyloxy group, a cyclopentyloxy group, a cyclohexyloxy group, a norbornyloxy group and an adamantyloxy group; and cycloalkenyloxy groups such as a cyclopropenyloxy group, a cyclobutenyloxy group, a cyclopentenyloxy group, a cyclohexenyloxy group and a norbornenyloxy group;

oxyaromatic hydrocarbon groups, e.g., aryloxy groups such as a phenoxy group, a tolyloxy group, a xylyloxy group, a mesityloxy group, a naphthyloxy group and an anthryloxy group; and aralkyloxy groups such as a benzyloxy group, a phenethyloxy group and a naphthylmethyloxy group; and the like.

Examples of the substituent of the hydrocarbon group include: halogen atoms such as a fluorine atom, a chlorine atom, a bromine atom and an iodine atom; a hydroxy group, a carboxy group, a cyano group, a nitro group, an alkoxy group, an alkoxycarbonyl group, an alkoxycarbonylalkoxy group, an acyl group and an acyloxy group; and the like.

$R^1$ and $R^2$ each represent preferably a chain hydrocarbon group, an aromatic hydrocarbon group or an oxy chain hydrocarbon group, more preferably an alkyl group, an aryl group or an alkoxy group, still more preferably an alkyl group having 1 to 4 carbon atoms, an aryl group having 6 to 10 carbon atoms or an alkoxy group having 1 to 4 carbon atoms, particularly preferably a methyl group, an ethyl group, a phenyl group, a naphthyl group, a methoxy group or an ethoxy group, and further particularly preferably a methyl group, a phenyl group or a methoxy group.

$R^3$ represents preferably a hydrogen atom or a chain hydrocarbon group, more preferably a hydrogen atom or an alkyl group, still more preferably a hydrogen atom, a methyl group or an ethyl group, and particularly preferably a hydrogen atom.

Examples of the compound (C) include β-diketones such as acetylacetone (2,4-pentanedione), 2,4-hexanedione, 2,4-trifluoropentanedione, 2,4-hexafluoropentanedione, 2,2,6,6-tetramethyl-3,5-heptanedione, 1,3-diphenyl-1,3-propanedione and 1-phenyl-1,3-butanedione; acetoacetic acid esters such as methyl acetoacetate and ethyl acetoacetate; malonic acid esters such as diethyl malonate and diethyl methylmalonate; and the like.

Of these, β-diketone and an acetoacetic acid ester are preferred, and acetylacetone, ethyl acetoacetate and 1-phenyl-1,3-butanedione are more preferred.

The content of the compound (C) with respect to 100 parts by mass of the polyacid (A) is preferably 5 parts by mass to 300 parts by mass, more preferably 10 parts by mass to 250 parts by mass, and still more preferably 20 parts by mass to 60 parts by mass. When the content of the compound (C) falls within the above range, the storage stability of the inorganic film-forming composition for a multilayer resist process (I) can be further improved.

Water

The inorganic film-forming composition for a multilayer resist process (I) may further contain water. When the inorganic film-forming composition for a multilayer resist process (I) further contains water, the storage stability can be further improved.

The content of water in the inorganic film-forming composition for a multilayer resist process (I) is preferably 3% by mass to 90 mass, and more preferably 5% by mass to 30% by mass.

Other Components

The inorganic film-forming composition for a multilayer resist process (I) may contain other component(s) such as a surfactant within a range not leading to impairment of the effects of the present invention.

Surfactant

The surfactant is a component that improves applicability, striation, and the like. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by Tochem Products Co. Ltd.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.); and the like.

The surfactant may be used either alone, or two or more types thereof may be used in combination. Also, the amount of the surfactant blended may be predetermined ad libitum depending on the goal.

Preparation Method of Inorganic Film-Forming Composition for a Multilayer Resist Process The inorganic film-forming composition for a multilayer resist process (I) may be prepared by, for example, mixing the polyacid or the salt thereof (A), the compound (C), water, the other component(s) and the like at a certain ratio in the organic solvent (B). The inorganic film-forming composition for a multilayer resist process (I) is usually prepared by dissolving in the solvent upon use thereof, and thereafter filtering the solution through a filter having a pore size of about 0.2 μm, for example.

EXAMPLES

Hereinafter, the present invention is explained in detail by way of Examples, but the present invention should not be construed to be limited to the Examples.

Preparation of Inorganic Film-Forming Composition for a Multilayer Resist Process Inorganic film-forming compositions for a multilayer resist process used in the pattern-forming methods of Examples and Comparative Examples were prepared according to the following procedures, respectively.

Synthesis Example 1

To 20.0 g of propylene glycol monoethyl ether were added 0.5 g of ammonium metatungstate $[(NH_4)_6 (H)_2][W_{12}O_{40}] \cdot nH_2O$ (n: about 6), 1.0 g of acetylacetone, 2.5 g of water, and 4.0 g of propylene glycol monomethyl ether acetate, and the mixture was stirred at room temperature for 30 min. The solution thus obtained was filtered using a filter having a pore size of 0.2 μm to prepare the inorganic film-forming composition for a multilayer resist process (P-1).

Synthesis Example 2

To 22.0 g of propylene glycol monopropyl ether were added 2.5 g of ammonium molybdate $[(NH_4)_6][Mo_7O_{24}] \cdot 4H_2O$, 1.0 g of ethyl acetoacetate and 4.5 g of water, and the mixture was stirred at room temperature for 30 min. The solution thus obtained was filtered using a filter having a pore size of 0.2 μm to prepare the inorganic film-forming composition for a multilayer resist process (P-2).

Synthesis Example 3

To 8.0 g of propylene glycol monomethyl ether were added 2.0 g of ammonium phosphotungstate $[(NH_4)_3][PW_{12}O_{40}] \cdot 3H_2O$, 1.0 g of 1-phenyl-1,3-butanedione, and 10.0 g of water, and the mixture was stirred at room temperature for 30 min. The solution thus obtained was filtered using a filter having a pore size of 0.2 μm to prepare the inorganic film-forming composition for a multilayer resist process (P-3).

Synthesis Example 4

An aqueous solution containing 20 mmol of tetramethylammonium hydroxide was prepared by mixing 3.646 g of 25% by mass tetramethylammonium hydroxide with 16.354 g of water. To this aqueous solution was slowly added 5.684 g of titanium tetraisopropoxide dropwise at room temperature, and the mixture was stirred to obtain an aqueous solution of polytitanic acid in which tetramethylammonium hydroxide was present at a ratio of 2 mol with respect to 1 mol of titanium atom. To 5.0 g of the resultant aqueous polytitanic acid solution, were added 12.0 g of 2-butanol and 3.0 g of propanedioic acid diethyl ester, and the mixture was stirred at room temperature for 30 min. The solution thus obtained was filtered using a filter having a pore size of 0.2 μm to prepare the inorganic film-forming composition for a multilayer resist process (P-4).

Synthesis Example 5

An aqueous solution containing 20 mmol of tetramethylammonium hydroxide was prepared by mixing 3.646 g of 25% by mass tetramethylammonium hydroxide with 16.354 g of water. To this aqueous solution was slowly added 6.364 g of niobium pentaethoxide dropwise at room temperature, and the mixture was stirred to obtain an aqueous solution of polyniobic acid in which tetramethylammonium hydroxide was present at a ratio of 1 mol with respect to 1 mol of niobium atom. To 5.0 g of the resultant aqueous polyniobic acid solution, were added 15.0 g of isopropanol and 2.5 g of 1-phenyl-1,3-butanedione, and the mixture was stirred at room temperature for 30 min. The solution thus obtained was filtered using a filter having a pore size of 0.2 μm to prepare the inorganic film-forming composition for a multilayer resist process (P-5).

Comparative Synthesis Example 1

In an inert gas atmosphere, 1.0 g of tungsten(VI) ethoxide was added to 19.0 g of propylene glycol monomethyl ether, and the mixture was stirred at room temperature for 30 min. The solution thus obtained was filtered using a filter having a pore size of 0.2 μm to prepare the inorganic film-forming composition for a multilayer resist process (CP-1).

Comparative Synthesis Example 2

In an inert gas atmosphere, 2.0 g of tungsten(VI) ethoxide and 1.0 g of acetylacetone were added to 18.0 g of propylene glycol monoethyl ether, and the mixture was stirred at room temperature for 30 min. To the resultant solution was slowly added 0.1 g of water, and the mixture was stirred at 60° C. for 60 min. The solution thus obtained was filtered using a filter having a pore size of 0.2 μm to prepare the inorganic film-forming composition for a multilayer resist process (CP-2).

Formation of Inorganic Film

Examples 1 to 5, and Comparative Examples 1 and 2

Each inorganic film-forming composition for a multilayer resist process prepared as described above was applied on the surface of a silicon wafer by using a spin coater ("1H-360S", manufactured by Mikasa Co., Ltd.), under a condition with a rotation frequency of 2,000 rpm for 20 sec and thereafter dried by heating on a hot plate at 250° C. for 60 sec to form an inorganic film.

Evaluations

The following evaluations were carried out on each inorganic film-forming composition for a multilayer resist process prepared as described above, and each inorganic film formed as described above. The results of the evaluations are shown in Table 1.

Evaluation of Stability in Ambient Air
  Stability of Composition

A container of each inorganic film-forming composition for a multilayer resist process prepared as described above was opened in an ambient air, and stirred for 600 min. Absorbance at 660 nm and 570 nm of each inorganic film-forming composition for a multilayer resist process before and after the stirring was measured by using a ultraviolet spectrophotometer ("V660", manufactured by JASCO Corporation). The stability in ambient air of the composition was evaluated as: "A" when the change in the absorbance after the stirring from before the stirring was no greater than 10% for both the wavelengths; and "B" when the change was greater than 10% for any one of the wavelengths.

Stability of Inorganic Film-Formation

A container of each inorganic film-forming composition for a multilayer resist process prepared as described above was opened in an ambient air, and closed with an airtight stopper again. Thereafter, the inorganic film-forming composition was stored at 35° C. for 28 days. During the storage, the container was opened in the ambient air every 7 days, and the composition was stirred, followed by closing the container with the airtight stopper again. An inorganic film was formed on the surface of a silicon wafer according to the method described in the above section "Formation of Inorganic Film" by using each inorganic film-forming composition for a multilayer resist process after the storage. On each inorganic film formed, the film thickness was measured at positions of 50 points by using Film Thickness Measurement System ("UV-1280SE", manufactured by KLA-Tencor Corp.), and the average film thickness was determined, which was defined as a film thickness Ta after the storage. Further, an inorganic film was formed by using each inorganic film-forming composition for a multilayer resist process before the storage according to a similar method to that described above, and an average film thickness was similarly determined, which was defined as an initial film thickness (Ta0). The difference (Ta–Ta0) between the film thickness Ta after the storage, and the initial film thickness Ta0 was determined, and a rate [(Ta–Ta0)/Ta0] of the difference with respect to the initial film thickness Ta0 was calculated as a rate of change in the film thickness. The stability in ambient air of the inorganic film-formation was evaluated as: "A" when the value of the rate of change in the film thickness is no greater than 10%; and "B" when the value of the rate of change is greater than 10%.

Evaluation of Thermal Stability
  Stability of Inorganic Film-Formation

Each inorganic film-forming composition for a multilayer resist process prepared as described above was heated at 80° C. for 6 hrs. An inorganic film was formed on the surface of a silicon wafer according to the method described in the above section "Formation of Inorganic Film" by using each inorganic film-forming composition for a multilayer resist process after the heating. On is each inorganic film formed, the film thickness was measured at positions of 50 points by using the aforementioned Film Thickness Measurement System, and the average film thickness was determined, which was defined as a film thickness Tb after the heating.

Further, an inorganic film was formed by using each inorganic film-forming composition for a multilayer resist process before the heating according to a similar method to that described above, and an average film thickness was similarly determined, which was defined as an initial film thickness (Tb0). The difference (Tb−T0) between the film thickness Tb after the heating, and the initial film thickness Tb0 was determined, and a rate [(Tb−Tb0)/Tb0] of the difference with respect to the initial film thickness Tb0 was calculated as a rate of change in the film thickness. The thermal stability of the inorganic film-formation was evaluated as: "A" when the value of the rate of change in the film thickness is no greater than 10%; and "B" when the value of the rate of change is greater than 10%.

TABLE 1

| Inorganic film-forming composition for multilayer resist process | Stability in ambient air | | Thermal stability |
| --- | --- | --- | --- |
| | composition | inorganic film-formation | inorganic film-formation |
| Example 1 P-1 | A | A | A |
| Example 2 P-2 | A | A | A |
| Example 3 P-3 | A | A | A |
| Example 4 P-4 | A | A | A |
| Example 5 P-5 | A | A | A |
| Comparative Example 1 CP-1 | B | B | B |
| Comparative Example 2 CP-2 | A | A | B |

From the results shown in Table 1, according to the pattern-forming method of Examples, it is proven that stability after storage of the inorganic film-forming composition for a multilayer resist process in the ambient air was superior, and that the thickness of the inorganic film was less likely to vary, irrespective of whether or not the composition was stored in the ambient air. In addition, according to the pattern-forming method of Examples, it is proven that the thickness of the inorganic film was less likely to vary, irrespective of whether or not the composition was heated during the storage. According to the pattern-forming method of Comparative Examples, it is proven that making both the stability in ambient air and the thermal stability favorable was impossible. Therefore, it is believed that according to the pattern-forming method of Examples, formation of a favorable pattern accompanied by less time-dependent alteration is enabled by using such an inorganic film with less time-dependent alteration of the film thickness, etc.

According to the pattern-forming method of the embodiment of the present invention, time-dependent alteration of the film thickness and the like of the inorganic film in storage of the inorganic film-forming composition for a multilayer resist process for a long period of time can be lessened, and in turn, a favorable pattern accompanied by less time-dependent alteration can be formed. Therefore, these can be suitably used in fabricating processes, etc., in production of semiconductors, in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A pattern-forming method comprising:
applying an inorganic film-forming composition on an upper face side of a substrate to provide an inorganic film;
forming a resist pattern on an upper face side of the inorganic film; and
dry-etching once or several times using the resist pattern as a mask such that the substrate has a pattern,
wherein the inorganic film-forming composition comprises:
a polyacid or a salt thereof;
an organic solvent; and
a compound represented by formula (1):

$$R^1\text{—CO—CHR}^3\text{—CO—R}^2 \qquad (1)$$

wherein, in the formula (1), $R^1$ and $R^2$ each independently represent a substituted or unsubstituted hydrocarbon group having 1 to 20 carbon atoms or a substituted or unsubstituted oxyhydrocarbon group having 1 to 20 carbon atoms; and $R^3$ represents a hydrogen atom or a substituted or unsubstituted hydrocarbon group having 1 to 20 carbon atoms.

2. The pattern-forming method according to claim 1, wherein the resist pattern is formed by:
applying a resist composition on an upper face side of the inorganic film to provide a resist film;
exposing the resist film; and
developing the resist film exposed.

3. The pattern-forming method according to claim 1, wherein a metal element composing the polyacid or the salt thereof is titanium, zirconium, vanadium, niobium, tantalum, molybdenum, tungsten or a combination thereof.

4. The pattern-forming method according to claim 1, wherein the polyacid is an isopolyacid, a heteropolyacid or a combination thereof.

5. The pattern-forming method according to claim 4, wherein the isopolyacid comprises an anion represented by formula (2):

$$[M_xO_y]^{m-} \qquad (2)$$

wherein, in the formula (2), M represents titanium, zirconium, vanadium, niobium, tantalum, molybdenum or tungsten; x is an integer of 1 to 200; y is an integer of 3 to 2,000; and m is an integer of 1 to 200.

6. The pattern-forming method according to claim 4, wherein a hetero atom composing the heteropolyacid is phosphorus, silicon or a combination thereof.

7. The pattern-forming method according to claim 6, wherein the heteropolyacid comprises an anion represented by formula (3):

$$[X_aM_bO_c]^{n-} \qquad (3)$$

wherein, in the formula (3), M represents titanium, zirconium, vanadium, niobium, tantalum, molybdenum or tungsten; X represents phosphorus or silicon; a is an integer of 1 to 100; b is an integer of 1 to 200; c is an integer of 3 to 2,000; and n is an integer of 1 to 200, wherein "a" is no greater than "b".

8. The pattern-forming method according to claim 1, wherein the inorganic film-forming composition further comprises water.

* * * * *